(12) United States Patent
Asahina

(10) Patent No.: US 6,591,408 B1
(45) Date of Patent: Jul. 8, 2003

(54) APPARATUS AND METHOD FOR DESIGNING SEMICONDUCTOR CIRCUIT, AND RECORDING MEDIUM

(75) Inventor: Akihiro Asahina, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 164 days.

(21) Appl. No.: 09/670,461

(22) Filed: Sep. 26, 2000

(30) Foreign Application Priority Data

Sep. 30, 1999 (JP) .......................................... 11-278531

(51) Int. Cl.⁷ .............................................. G06F 9/455
(52) U.S. Cl. ............................ 716/11; 716/10; 716/12
(58) Field of Search .......................... 716/8, 9, 10, 11, 716/12; 395/500.01; 364/491, 490

(56) References Cited

U.S. PATENT DOCUMENTS

| | | | | |
|---|---|---|---|---|
| 5,648,913 A | * | 7/1997 | Bennett et al. | 716/16 |
| 5,659,484 A | * | 8/1997 | Bennett et al. | 364/491 |
| 5,917,729 A | * | 6/1999 | Naganuma et al. | 716/10 |
| 6,035,106 A | * | 3/2000 | Carruthers et al. | 703/1 |
| 6,370,677 B1 | * | 4/2000 | Carruthers et al. | 716/11 |
| 6,080,206 A | * | 6/2000 | Tadokoro et al. | 716/10 |

FOREIGN PATENT DOCUMENTS

| | | |
|---|---|---|
| JP | 8-30655 | 2/1996 |
| JP | 8-221473 | 8/1996 |
| JP | 10-135342 | 5/1998 |
| JP | 10-335473 | 12/1998 |

* cited by examiner

Primary Examiner—Matthew Smith
Assistant Examiner—Binh C. Tat
(74) Attorney, Agent, or Firm—Katten Muchin Zavis Rosenman

(57) ABSTRACT

A floorplan design unit lays out a plurality of functional blocks of a semiconductor integrated circuit in a predetermined area. Paths of clock lines in the functional blocks are designed so that clock skew of each functional block satisfies predetermined conditions. A wiring eraser erases clock lines in the functional blocks laid out in the predetermined area. An on-circuit wiring layout unit determines paths of clock lines in the functional blocks from which the clock lines are erased, and determines paths of clock lines among the functional blocks so that clock skew of whole semiconductor integrated circuit satisfies predetermined conditions. The on-circuit wiring layout unit determines the clock line paths over the semiconductor integrated circuit with targeting an upper wiring layer.

9 Claims, 6 Drawing Sheets

APPARATUS AND METHOD FOR DESIGNING SEMICONDUCTOR CIRCUIT, AND RECORDING MEDIUM

BACKGROUND OF THE INVENTION

1. Field of the Invention

The present invention relates to an apparatus and method for designing a semiconductor integrated circuit, more particularly to an apparatus and method for designing clock line. The present invention also relates to a recording medium storing a program for designing a semiconductor integrated circuit, more particularly, to a recording medium storing a program for designing clock line.

2. Description of the Related Art

Top-down design and bottom-up design have been known as methods for designing a semiconductor integrated circuit.

The top-down design is to design functional blocks on a semiconductor integrated circuit in accordance with timing design and desired clock skew.

In the top-down design, since design of the functional blocks depends on the requirements of the whole circuit, one functional block requires plural sets of wiring patterns for various semiconductor circuits. In a semiconductor circuit designed by the top-down design, the same functional blocks may have different wiring patterns. Such the differences in the wiring patterns bring differences in performance among the functional blocks. As a result, function or performance of the circuit as a whole may be deteriorated.

By the bottom-up design, each functional block is designed in accordance with its own timing design and desired clock skew, then a semiconductor integrated circuit is designed with using thus designed functional blocks. Unexamined Japanese Patent Application KOKAI Publication No. H10-135342 discloses a technique for designing functional blocks, wherein cells on a functional block are arranged, and wiring other than clock line is designed so as to be formed on wiring layers other than a top layer and clock line is designed so as to be formed on the top wiring layer.

Each functional block on a semiconductor integrated circuit designed by the bottomup design is designed so as to minimize clock skew of each functional block. According to this structure, clock skews of the functional blocks are not equal. For realizing desired performance of a semiconductor integrated circuit, clock skews must be coincided with each other. In this case, the maximum clock skew is the reference for the coincidence. Extension of inter-block clock line or a buffer for clock skew adjustment are required for adjusting clock skews. Such the wiring extension may bring wiring delay and occupies spaces for other wiring. Those are negative factors for the circuit's performance.

Unexamined Japanese Patent Application KOKAI Publication No. H8-30655 discloses a technique based on the bottom-up design, wherein a semiconductor integrated circuit is designed with using functional blocks each having a synchronizing element in which a delay adjuster area is prepared. Ready-made adjuster elements for adjusting various clock skews are installed in the delay adjuster area. According to this technique, appropriate adjuster elements are installed in the delay adjuster area after functional blocks are arranged on a semiconductor integrated circuit in order to adjust clock skews of the semiconductor integrated circuit.

Since the ready-made adjuster elements are used in the above technique, it is difficult to adjust clock skews finely.

If fine-adjustment of the clock skews is unavailable, it is difficult to design a semiconductor integrated circuit which shows desired performance.

Unexamined Japanese Patent Application KOKAI Publication No. H8-221473 discloses a technique, wherein functional blocks are temporarily arranged on a semiconductor integrated circuit, and tentative inter-block clock line is determined. Then, inter-block delay time and intra-block delay time are obtained. Finally, positions of the cells in each functional block, intra-block wiring, and inter-block wiring are shifted and fixed.

According to this technique, since cells in a functional block are shifted, desired performance of the functional block may be unavailable. As a result, it takes many steps for designing the circuit, because the functional block designed under this technique often requires re-designing.

This specification includes the techniques disclosed in Unexamined Japanese Patent Application KOKAI Publication Nos. H8-30655, H8-221473 and H10-135342.

SUMMARY OF THE INVENTION

It is an object of the present invention to provide an apparatus and method for efficient design of a semiconductor integrated circuit with satisfying predetermined conditions. It is another object of the present invention to provide a recording medium storing a program for efficient design of a semiconductor integrated circuit with satisfying predetermined conditions.

To achieve the above objects, a design apparatus according to a first aspect of the present invention comprises:

- a block layout design unit which designs layout of a plurality of functional blocks within a predetermined area in a semiconductor integrated circuit, wherein clock lines on each of the functional blocks have been laid out so that clock skew of each functional block is minimized;
- a wiring erasing unit which pre-designed erases clock lines in the functional blocks laid out in the predetermined area; and
- an on-circuit wiring layout design unit which determines clock line paths in the functional blocks from which the clock lines are erased, and determines clock lines among the functional blocks, so that clock skew of whole semiconductor integrated circuit satisfies predetermined conditions.

According to this invention, it is able to design a semiconductor integrated circuit which satisfies predetermined conditions with ease.

The on-circuit wiring layout design unit may determine clock lines over the semiconductor integrated circuit with targeting an upper wiring layer.

The on-circuit wiring layout design unit may comprise:

- a draft unit which generates a clock tree to draft paths of the clock lines; and
- a path adjuster unit which adjusts the drafted paths so that clock skew of whole semiconductor integrated circuit satisfies predetermined conditions.

The design apparatus may further comprise a block design unit which designs the plurality of the functional blocks.

The block design unit may comprise:

- a cell layout design unit which lays out a plurality of cells of a functional block;
- an in-block wiring layout design unit which determines clock line paths in the functional block so that clock skew of the functional block satisfies predetermined conditions; and a wiring layout design unit which determines wiring paths other than the clock line paths in accordance with timing design of the functional block.

A design method according to a second aspect of the present invention comprises:

designing layout of a plurality of functional blocks of a semiconductor integrated circuit in a predetermined area, wherein clock line paths are laid out on each of the functional blocks so that clock skew of each functional block satisfies predetermined conditions;

erasing pre-designed clock lines in the functional blocks laid out in the predetermined area; and determining clock line paths in the functional blocks from which the pre-designed clock lines are erased, and clock lines among the functional blocks so that clock skew of whole semiconductor integrated circuit satisfies predetermined conditions.

The determining clock line paths in the functional blocks and clock line paths among the functional blocks may comprise determining clock line paths over the semiconductor integrated circuit with targeting an upper wiring layer.

The determining clock line paths in the functional blocks and clock line paths among the functional blocks may comprise:

generating a clock tree to draft paths of the clock lines; and adjusting the drafted paths so that clock skew of whole semiconductor integrated circuit satisfies predetermined conditions.

The design method may further comprise designing the plurality of the functional blocks.

The designing the functional blocks may comprise:

designing layout of a plurality of cells of the functional blocks;

determining paths of clock lines in each of the functional blocks so that clock skew of each functional block satisfies predetermined conditions; and determining paths of wiring other than the clock lines in accordance with timing design of each functional block.

A computer readable recording medium according to a third aspect of the present invention is a recording medium storing a program to be executed by a computer by which the computer functions as a design apparatus comprises:

a block layout design unit which designs layout of a plurality of functional blocks within a predetermined area in a semiconductor integrated circuit, wherein clock lines on each of the functional blocks have been laid out so that clock skew of each functional block is minimized;

a wiring erasing unit which pre-designed erases clock lines in the functional blocks laid out in the predetermined area; and an on-circuit wiring layout design unit which determines clock line paths in the functional blocks from which the clock lines are erased, and determines clock lines among the functional blocks, so that clock skew of whole semiconductor integrated circuit satisfies predetermined conditions.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A design system according to an embodiment of the present invention will now be described with reference to the accompanying drawings.

The design system according to the embodiment of the present invention designs a semiconductor integrated circuit.

Figure 1:
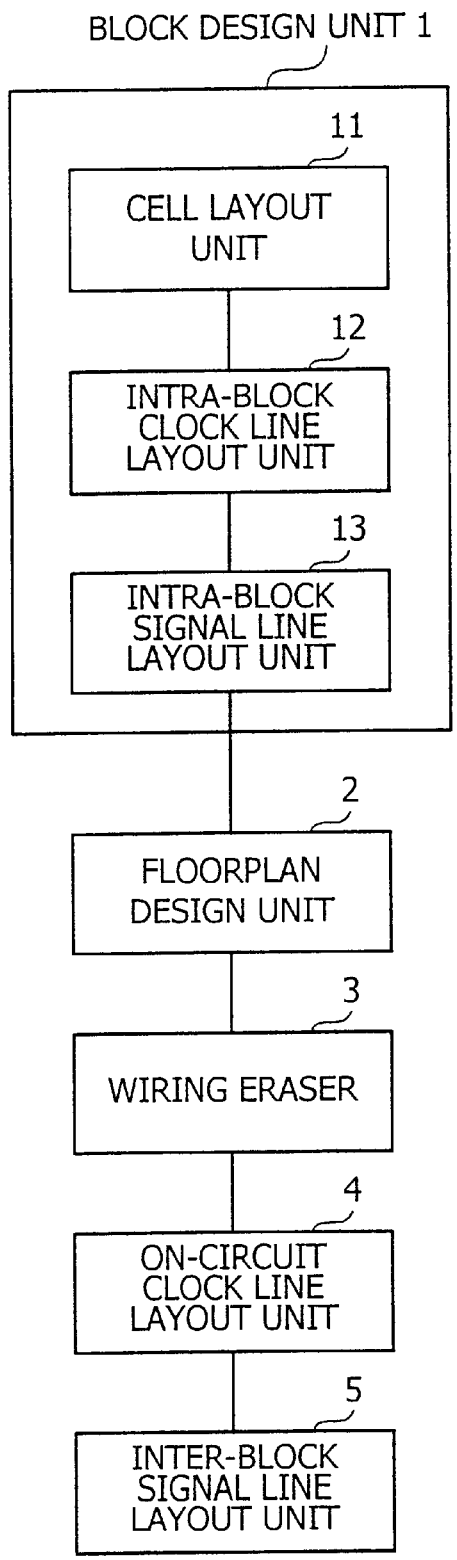
FIG. 1 is a diagram showing the configuration of a design system according to an embodiment of the present invention.

As shown in FIG. 1, the design system comprises a block design unit 1, a floorplan design unit 2, a wiring eraser 3, an on-circuit clock line layout unit 4, and an inter-block signal line layout unit 5. The following actions are carried out as simulation based on data.

The block design unit 1 designs a plurality of functional blocks to be formed on a semiconductor integrated circuit. As shown in FIG. 1, the block design unit 1 comprises a cell layout unit 11, an intra-block clock line layout unit 12, and an intra-block signal line layout unit 13.

The cell layout unit 11 lays out cells within a predetermined area in each functional block. In this case, the cells are logic circuits such as NAND, NOR, or the like.

The intra-block clock line layout unit 12 drafts clock line pattern for each functional block based on data representing cell layout. The purpose of the clock line is to supply clock signals to the cells. More precisely, the intra-block clock line layout unit 12 prepares a clock tree to determine the clock line pattern. The intra-block clock line layout unit 12 obtains clock skew of each functional block, and determines detailed pattern of the clock line so that the clock skew is minimized in a predetermined range. More precisely, the intra-block clock line layout unit 12 shifts the clock line paths, lays out buffers on the paths, etc. The intra-block clock line layout unit 12 may shift cell layout so as to minimize the clock skew in the predetermined range.

The intra-block signal line layout unit 13 determines signal line pattern for each functional block based on data representing cell layout. The purpose of the signal line is to supply signals other than the clock signal to each cell. More precisely, the intra-block signal line layout unit 13 determines the signal line pattern in accordance with predetermined timing design. The intra-block signal line layout unit 13 may shifts the cell layout in accordance with the timing design.

The floorplan design unit 2 lays out the functional blocks designed by the block design unit 1 within a predetermined area. More precisely, the floorplan design unit 2 determines layout so that all the functional blocks are arranged within a semiconductor integrated circuit.

The wiring eraser 3 erases only the clock line in each functional block. More precisely, the wiring eraser 3 erases data representing the clock line from design data of each functional block.

The on-circuit clock line layout unit 4 drafts inter-block clock line pattern and intra-block clock line pattern based on data representing layouts of the blocks and cells. More precisely, the on-circuit wiring layout 4 prepares a clock tree to determine the clock line pattern over the whole semiconductor integrated circuit. In this case, the on-circuit clock line layout unit 4 targets a layer upper than a wiring layer for intra-block signal line. For example, the target layer may be an aluminum layer having less wiring capacitance and wiring resistance. The on-circuit clock line layout unit 4 obtains clock skew of the semiconductor integrated circuit, and determines detailed clock line pattern so as to minimize the clock skew in a predetermined range. More precisely, the on-circuit clock line layout unit 4 shifts the clock line paths, lays out buffers on the paths, etc.

The inter-block signal line layout unit 5 determines inter-block signal line pattern based on data representing layouts of the blocks and cells. More precisely, the inter-block signal line layout unit 5 determines the signal line pattern in accordance with the predetermined timing design of the semiconductor integrated circuit.

Figure 2A:
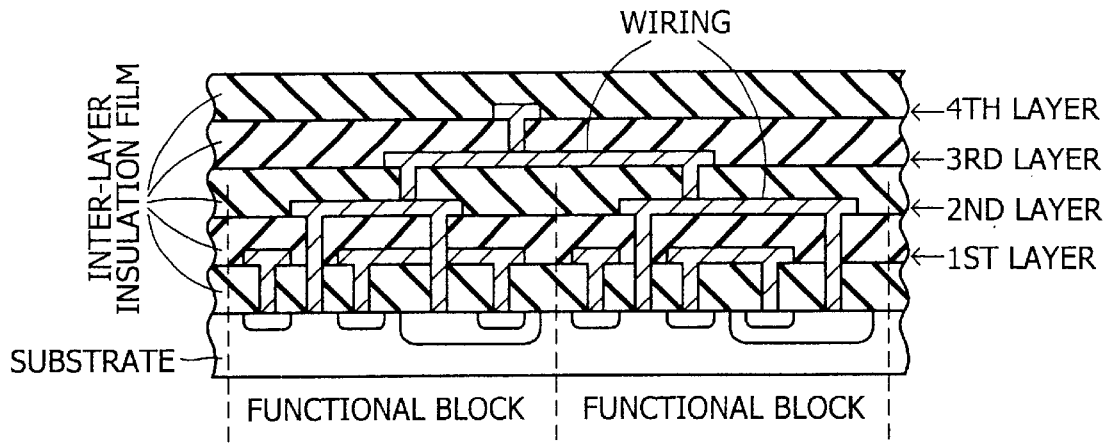
FIG. 2A is a cross sectional view showing the conventional structure of wiring layers.
Figure 2B:
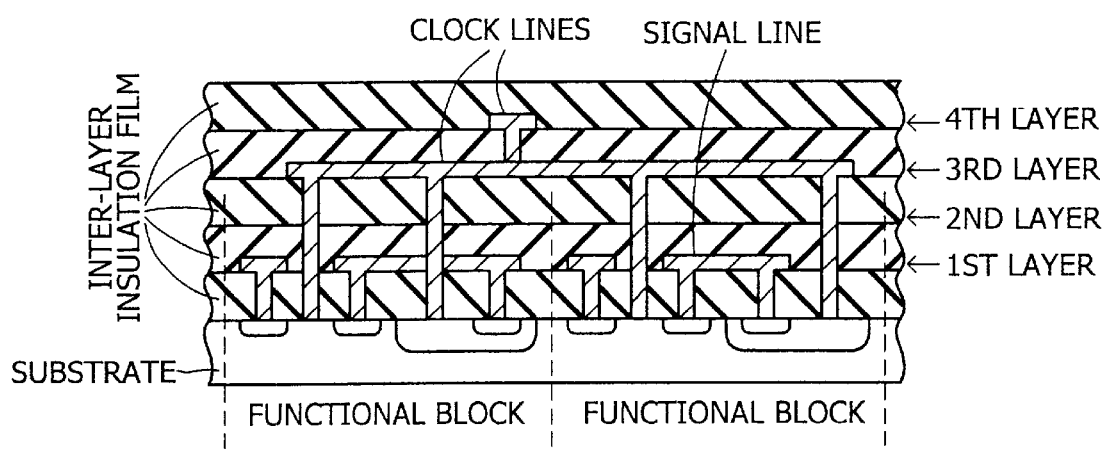
FIG. 2B is a cross sectional view showing the structure of wiring layers designed by the design system shown in FIG. 1.

In general, intra-block wiring is formed on lower wiring layers (first and second wiring layers), and inter-block wiring is formed on upper wiring layers (third and fourth wiring layers), as shown in FIG. 2A. As aforementioned, the on-circuit clock line layout unit 4 targets the upper wiring layer to determine the clock line pattern in the functional block as shown in FIG. 2B. That is, the conventional method determines the intra-block wiring pattern, then determines the inter-block wiring pattern. On the contrary, the above described design system deletes only the clock lines in the functional blocks, and re-designs wiring pattern. According to this structure, efficient clock line pattern is available without changing other wiring pattern in the functional block such as signal line pattern which has been established in accordance with the timing design. That is, the above described design system is helpful to design a semiconductor integrated circuit with achieving performance satisfaction without extra steps.

Operations of thus structured design system will now be described.

A user operates the design system to invoke it, and inputs information regarding to a target semiconductor integrated circuit (for example, circuit function, clock skew range, timing design, etc.). The user may operate a keyboard or the like to input the information, or may transfer the information from a recording medium or the like.

Figure 3:
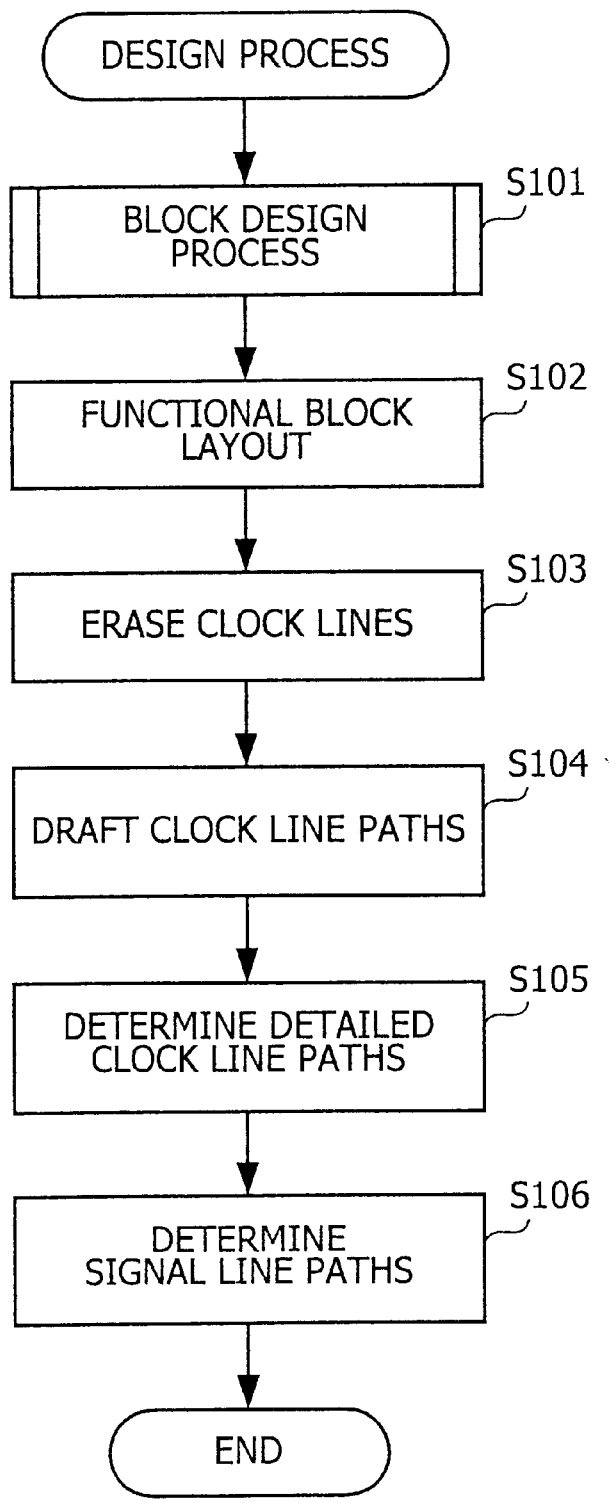
FIG. 3 is a flowchart for explaining design process executed by the design system shown in FIG. 1.

FIG. 3 is a flowchart for explaining design process executed by the design system. The block design unit 1 designs a plurality of functional blocks for the semiconductor integrated circuit (step S101).

Figure 4:
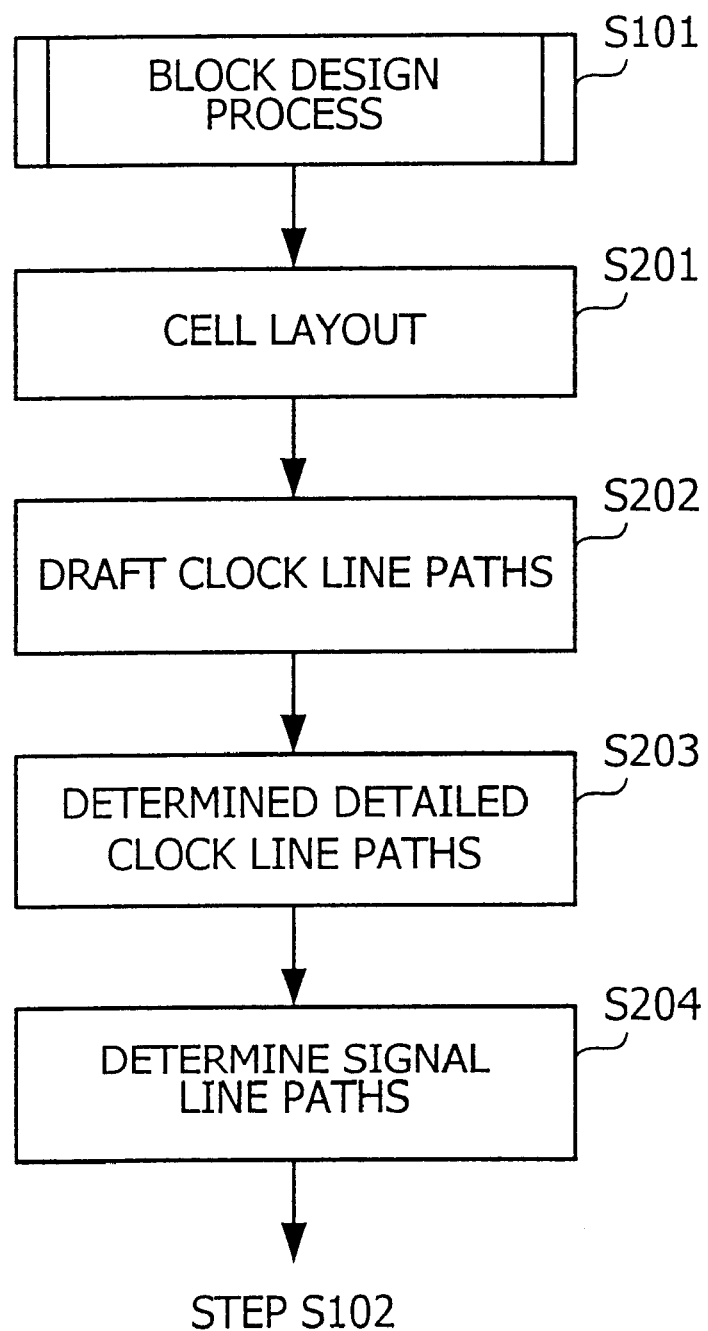
FIG. 4 is a flowchart for explaining process for block design executed by a block design unit in the design system shown in FIG. 1.

FIG. 4 is flowchart showing steps of the block design process executed by the block design unit 1.

The cell layout unit 11 of the block design unit 1 lays out necessary cells within a predetermined area (step S201).

The intra-block clock line layout unit 12 generates a clock tree based on data representing cell layout to draft clock line pattern in each functional block (step S202).

Then, the intra-block clock line layout unit 12 obtains clock skew of each functional block, and determines detailed clock line pattern in each functional block so as to minimize the clock skew in the predetermined range (step S203). For the clock skew adjustment, the intra-block clock line layout 12 may shift cell layout.

The intra-block signal line layout unit 13 determines signal line pattern in each functional block in accordance with predetermined timing design (step S204). For optimizing the signal line pattern, the intra-block wiring layout 13 may shift the cell layout.

Thus, designing functional blocks with less clock skew while being compatible with the timing design is completed.

After the block design is completed, the floorplan design unit 2 lays out the functional blocks designed by the block design unit 1 within a predetermine area (step S102).

Then, the wiring eraser 3 erases only the clock line in the functional blocks (step S103). That is, the wiring eraser 3 deletes data representing the clock line form the design data for the functional blocks.

The on-circuit clock line layout unit 4 drafts inter- and intra-block clock line pattern based on data representing layouts of the blocks and cells. More precisely, the on-circuit clock line layout unit 4 generates a clock tree to determine the clock line pattern over the semiconductor integrated circuit (step S104). In this case, the on-circuit clock line layout unit 4 targets a layer upper than a layer on which the signal line is formed.

The on-circuit clock line layout unit 4 obtains clock skew of the whole semiconductor integrated circuit, and determines detailed clock line pattern so as to minimize the clock skew in a predetermined range (step S105).

Then, the inter-block signal line layout unit 5 determines inter-block signal line pattern based on data representing layouts of the blocks and cells, in accordance with predetermined timing design of the semiconductor integrated circuit (step S106).

Thus, a semiconductor integrated circuit having predetermined function and performance is designed by the design system.

As described above, the on-circuit clock line layout unit 4 determines the clock line pattern on the upper wiring layer for the semiconductor integrated circuit after erasing the clock lines in the functional blocks. This structure is effective in determining clock line pattern of whole circuit without changing optimized operation timing of the functional blocks. Moreover, since intra- and inter- block clock line pattern are determined in the same process, least length clock line paths are determined efficiently. According to this structure, it is able to easily design various semiconductor integrated circuit with using already designed functional blocks.

The operations of the design system will now be described in detail.

The user operates the design system to invoke it, and inputs information regarding to a target semiconductor integrated circuit (for example, circuit function, clock skew range, timing design, etc.). The user may operate a keyboard or the like to input the information, or may transfer the information from a recording medium or the like.

The design system executes the design process shown in FIG. 3 to design the semiconductor integrated circuit.

The block design unit 1 designs a plurality of functional blocks for a semiconductor integrated circuit (step S101).

Figure 5A:
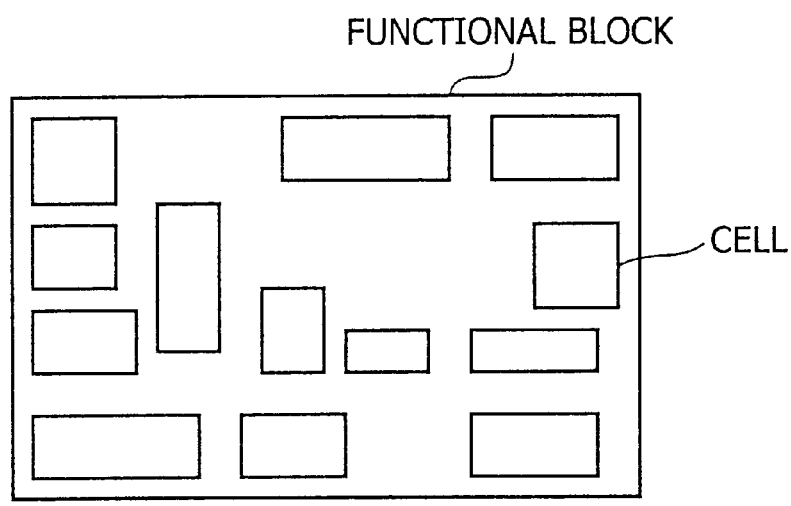
FIGS. 5A to 5C are diagrams showing process for designing a functional block.

More precisely, the cell layout unit 11 of the block design unit 1 lays out necessary cells within a predetermined area in each functional block as shown in FIG. 5A (step S201).

The intra-block clock line layout unit 12 generates a clock tree to draft clock line pattern for each functional block based on data representing cell layout (step S202).

Figure 5B:
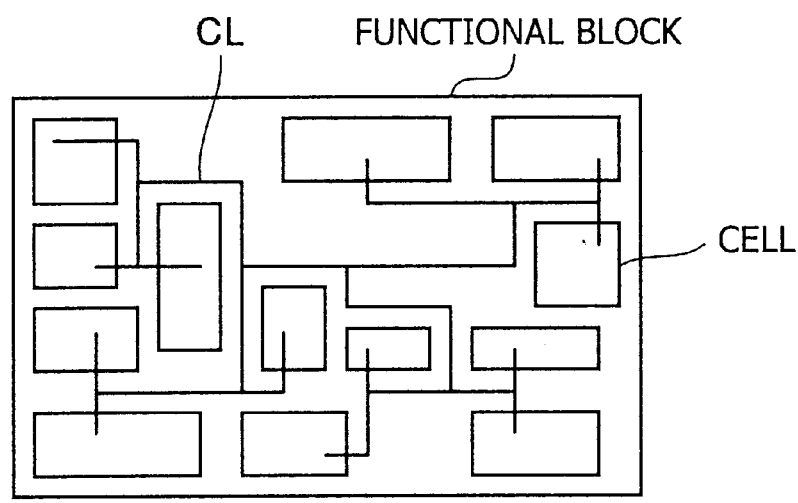

Then, the intra-block clock line layout unit 12 obtains clock skew of the functional blocks, and determines detailed clock line pattern in each functional block so as to minimize the clock skew in a predetermined range (step S203). Thus, pattern of the clock line CL are determined as shown in FIG. 5B.

Figure 5C:
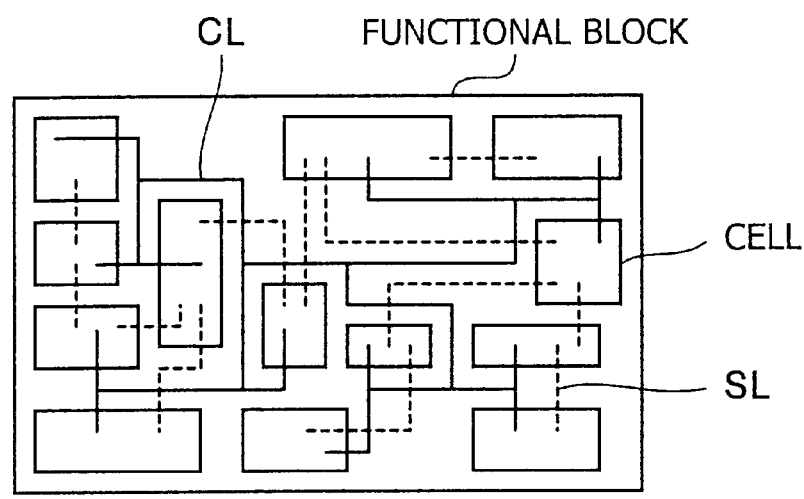

Then, the intra-block signal line layout unit 13 determines pattern of signal line SL in each functional block in accordance with predetermined timing design as shown in FIG. 5C (step S204). In FIG. 5C, the clock line CL is indicated by solid lines and the signal line SL is indicated by dotted lines for distinguish them.

Designing functional blocks with less clock skew while being compatible with appropriate timing design are thus completed.

Figure 6A:
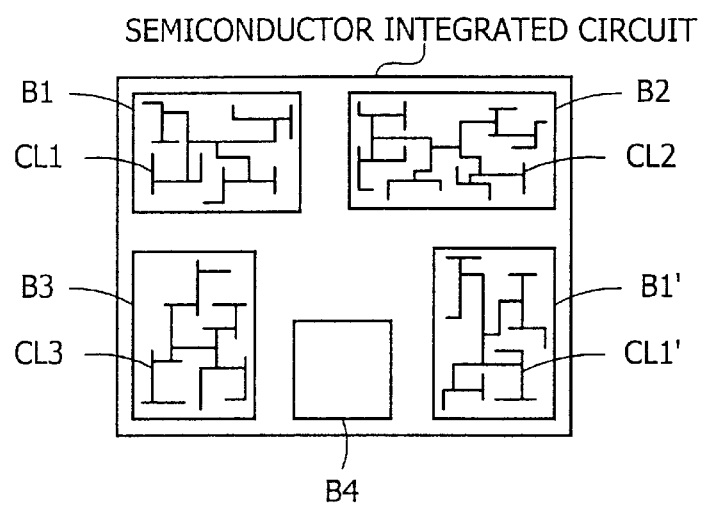
FIGS. 6A to 6C are diagrams showing process for designing a semiconductor integrated circuit.
Figure 6B:
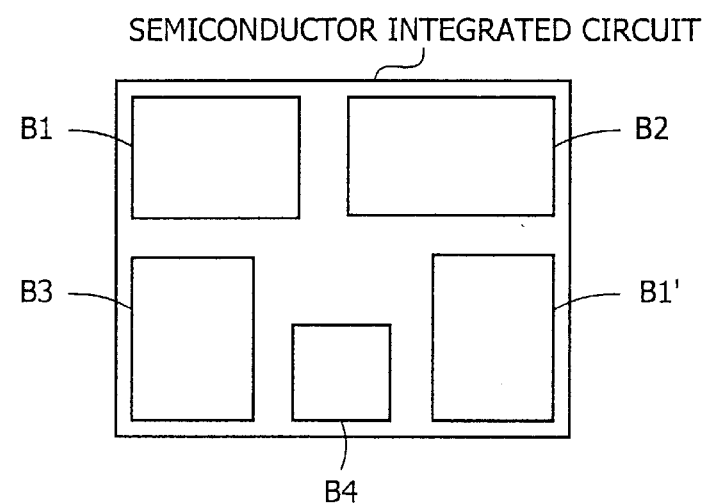

After designing the functional blocks, the floorplan design unit 2 lays out the functional blocks B1, B2, B3, B4 and B1' designed by the block design unit 1 within the semiconductor integrated circuit as shown in FIG. 6A (step S102). In FIG. 6A, reference symbols CL1 to CL3 and CL1' denote the clock lines in the functional blocks B1 to B3 and B1' respectively. No clock line is applied to a functional block B4. The functional blocks B1 and B1' have the same function. Since the blocks B1 and B1' have the same function, their clock line layouts are the same. The cells and signal lines in the functional blocks are not shown in FIGS. 6A and 6C for simplifying the diagrams.

The wiring eraser 3 erases only the clock lines in the functional blocks (step S103).

That is, the wiring eraser 3 deletes data representing the clocks lines from the design data for the functional blocks.

Then, the on-circuit clock line layout unit 4 generates a clock tree based on data representing layouts of the blocks and cells to draft the clock line pattern over the semiconductor integrated circuit (step S104). In this case, the on-circuit clock line layout unit 4 targets a layer upper than a layout on which the signal lines for the functional blocks are formed.

Figure 6C:
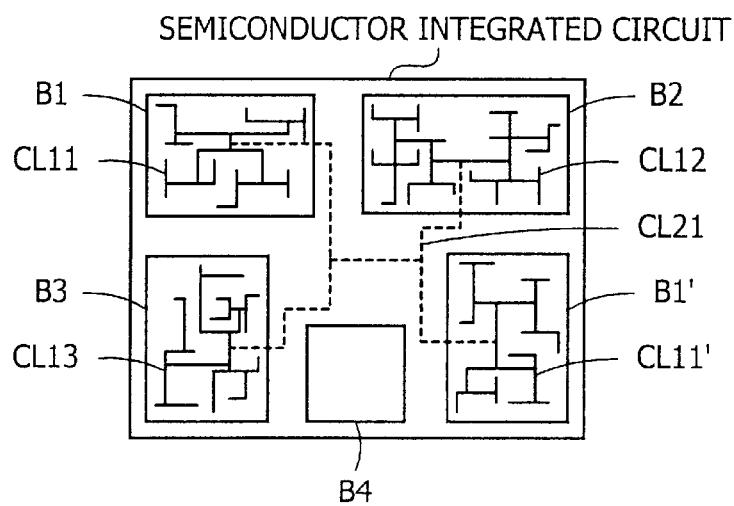

The on-circuit clock line layout unit 4 obtains clock skew of the semiconductor integrated circuit, and determines detailed clock line pattern so as to minimize the clock skew in a predetermined range as shown in FIG. 6C (step S105). In FIG. 6C, reference symbols CL11 to CL13 and CL11' denote optimized clock lines in the functional blocks B1 to B3 and B1' respectively, and a reference symbol CL21 denotes inter-block clock lines (indicated by dotted lines). As shown in FIG. 6C, the same functional blocks B1 and B1' have different clock wiring patterns (CL11 and CL11') because they are arranged so as to minimize the clock skew of the semiconductor integrated circuit. However, since other wiring paths have not been changed, the functional blocks B1 and B1' show the equal performance.

The inter-block signal line layout unit 5 determines inter-block signal line pattern (not shown) based on data representing layouts of the blocks and cells, in accordance with timing design for the semiconductor integrated circuit (step S106).

Thus, the designing a semiconductor integrated circuit having predetermined functions and quality is completed.

As aforementioned, the clock line patterns in functional blocks are designed individually even if the same functional blocks, in order to minimize clock skew of a semiconductor integrated circuit, however, other elements are not changed. This structure allows the semiconductor integrated circuit to have optimized clock skew while each functional block is compatible with its own timing design. As a result, effective usage of the functional blocks designed by the block design unit 1 (that is, pre-designed blocks) is available. Moreover, the design system requires no complex algorithms. Accordingly, it is able to design a semiconductor integrated circuit with ease. Instead of an apparatus designed for single purpose, a general computer may act as the apparatus of the present invention. For example, distribution of recording media (floppy disk, CD-ROM, etc.) storing programs and data necessary for executing the above described tasks by a computer may be applicable. In this case, the programs and data will be transferred to the computer to be executed under the OS(Operating System), thus, an apparatus which can execute the above described tasks is available.

The media for distributing the program and data are not limited to the solid media such as CD-ROM. For example, the programs and data may be distributed through communication network such as the internet. In this case, the programs and data may be registered at FTP (File Transfer Protocol) server, BBS(Bulletin Board System), etc. Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-278531 filed on Sep. 30, 1999 and including specification, claims, drawings and summary. The disclosure of the above Japanese Patent Application is incorporated herein by reference in its entirety.

What is claimed is:

1. A design apparatus comprising:
   a block design unit which designs a plurality of functional blocks for a semiconductor integrated circuit, wherein clock lines and functional cells on each of said functional blocks have been laid out so that clock skew of each functional block is minimized;
   a floorplan design unit for laying out the plurality of functional blocks within a predetermined area in the semiconductor circuit;
   a wiring erasing unit which erases pre-designed clock lines in said functional blocks laid out in said predetermined area; and
   an on-circuit wiring layout design unit which determines clock line paths in said functional blocks from which said clock lines are erased, and determines clock lines among said functional blocks, so that clock skew of whole semiconductor integrated circuit satisfies predetermined conditions.

2. The design apparatus according to claim 1, wherein said on-circuit wiring layout design unit determines clock lines over said semiconductor integrated circuit with targeting an upper wiring layer.

3. The design apparatus according to claim 2, wherein said on-circuit wiring layout design unit comprises:
   a draft unit which generates a clock tree to draft paths of said clock lines; and
   a path adjuster unit which adjusts said drafted paths so that clock skew of whole semiconductor integrated circuit satisfies predetermined conditions.

4. The design apparatus according to claim 3, wherein said block design unit comprises:
   a cell layout design unit which lays out a plurality of cells of a functional block;

an in-block wiring layout design unit which determines clock line paths in said functional block so that clock skew of said functional block satisfies predetermined conditions; and a wiring layout design unit which determines wiring paths other than said clock line paths in accordance with timing design of said functional block.

5. A design method comprising:

designing a plurality of functional blocks of a semiconductor integrated circuit, wherein clock line paths and functional cells are laid out on each of said functional blocks so that clock skew of each functional block is minimized;

laying out the plurality of functional blocks within a predetermined area in the semiconductor circuit;

erasing pre-designed clock lines in said functional blocks laid out in the predetermined area; and determining clock line paths in said functional blocks from which said predesigned clock lines are erased, and clock lines among said functional blocks so that clock skew of whole semiconductor integrated circuit satisfies predetermined conditions.

6. The design method according to claim 5, wherein said determining clock line paths in said functional blocks and clock line paths among said functional blocks comprises determining clock line paths over said semiconductor integrated circuit with targeting an upper wiring layer.

7. The design method according to claim 6 wherein said determining clock line paths in said functional blocks and clock line paths among said functional blocks comprises:

generating a clock tree to draft paths of said clock lines; and adjusting the drafted paths so that clock skew of whole semiconductor integrated circuit satisfies predetermined conditions.

8. The design method according to claim 7, wherein said designing said functional blocks comprises:

designing layout of a plurality of cells of said functional blocks;

determining paths of clock lines in each of said functional blocks so that clock skew of each functional block satisfies predetermined conditions; and determining paths of wiring other than said clock lines in accordance with timing design of each functional block.

9. A computer readable recording medium storing a program to be executed by a computer by which said computer functions as a design apparatus comprising:

a block design unit which designs a plurality of functional blocks for a semiconductor integrated circuit, wherein clock lines and functional cells on each of said functional blocks are laid out so that clock skew of each functional block is minimized;

a floorplan design unit for laying out the plurality of functional blocks within a predetermined area in the semiconductor integrated circuit;

a wiring erasing unit which erases pre-designed clock lines in said functional blocks laid out in said predetermined area; and an on-circuit wiring layout design unit which determines clock line paths in said functional blocks from which said clock lines are erased, and determines clock lines among said functional blocks, so that clock skew of whole semiconductor integrated circuit satisfies predetermined conditions.

* * * * *